US012593636B2

(12) United States Patent
Li et al.

(10) Patent No.: US 12,593,636 B2
(45) Date of Patent: Mar. 31, 2026

(54) MANUFACTURING METHOD OF SEMICONDUCTOR STRUCTURE

(71) Applicant: United Microelectronics Corp., Hsinchu (TW)

(72) Inventors: Kun-Ju Li, Tainan (TW); Hsin-Jung Liu, Pingtung County (TW); Jhih Yuan Chen, Kaohsiung (TW); I-Ming Lai, Kaohsiung (TW); Ang Chan, Taipei (TW); Wei Xin Gao, Tainan (TW); Hsiang Chi Chien, Pingtung County (TW); Hao-Che Hsu, Tainan (TW); Chau Chung Hou, Tainan (TW); Zong Sian Wu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 401 days.

(21) Appl. No.: 18/487,141

(22) Filed: Oct. 16, 2023

(65) Prior Publication Data

US 2025/0096000 A1 Mar. 20, 2025

(30) Foreign Application Priority Data

Sep. 18, 2023 (TW) ................................. 112135432

(51) Int. Cl.
*H01L 29/06* (2006.01)
*H01L 21/304* (2006.01)
(Continued)

(52) U.S. Cl.
CPC ...... *H01L 21/304* (2013.01); *H01L 21/30604* (2013.01); *H01L 21/76259* (2013.01)

(58) Field of Classification Search
CPC ............. H10D 64/021; H10D 30/0227; H10D 30/603; H10D 84/83; H10D 84/017;
(Continued)

(56) References Cited

U.S. PATENT DOCUMENTS 7,129,172 B2 * 10/2006 Morrow ................ H01L 21/304
438/455
8,119,500 B2 2/2012 Yang et al.
(Continued)

*Primary Examiner* — Theresa T Doan
(74) *Attorney, Agent, or Firm* — JCIPRNET

(57) ABSTRACT

A manufacturing method of a semiconductor structure includes the following steps. A first wafer is provided. The first wafer includes a first substrate and a first device layer. A second wafer is provided. The second wafer includes a second substrate and a second device layer. The second device layer is bonded to the first device layer. An edge trimming process is performed on the first wafer and the second wafer to expose a first upper surface of the first substrate and a second upper surface of the first substrate and to form a damaged region in the first substrate below the first upper surface and the second upper surface. The second upper surface is higher than the first upper surface. A first photoresist layer is formed. The first photoresist layer is located on the second wafer and the second upper surface and exposes the first upper surface and the damaged region. The damaged region is removed by using the first photoresist layer as a mask. The first photoresist layer is removed.

20 Claims, 5 Drawing Sheets

(51) Int. Cl.
 *H01L 21/306* (2006.01)
 *H01L 21/762* (2006.01)

(58) Field of Classification Search
 CPC ........... H10D 84/0174; H10D 84/0184; H10D
  62/307; H10D 84/013; H10D 30/0221;
  H10D 64/514; H10D 64/663; H10D
  30/0212; H10D 84/0177; H10D 84/8312;
  H10D 84/83135; H10D 84/8316; H10D
  84/856; H10D 30/0223
 USPC ........................................................ 257/213
 See application file for complete search history.

(56) References Cited

U.S. PATENT DOCUMENTS

| | | | |
|---|---|---|---|
| 8,278,189 B2 | 10/2012 | Hsieh | |
| 8,298,916 B2 | 10/2012 | Vaufredaz et al. | |
| 8,753,460 B2 | 6/2014 | Knickerbocker et al. | |
| 8,765,578 B2 | 7/2014 | La Tulipe, Jr. et al. | |
| 9,508,659 B2 | 11/2016 | Lu et al. | |
| 10,580,823 B2 * | 3/2020 | Zhang | H01L 25/50 |
| 11,152,276 B2 | 10/2021 | Li et al. | |
| 2006/0219351 A1 | 10/2006 | Kuan et al. | |
| 2014/0113452 A1 | 4/2014 | Lin et al. | |
| 2019/0355812 A1 | 11/2019 | Li et al. | |
| 2021/0305205 A1 | 9/2021 | Hsieh et al. | |
| 2023/0197467 A1 | 6/2023 | Li et al. | |

* cited by examiner

MANUFACTURING METHOD OF SEMICONDUCTOR STRUCTURE

CROSS-REFERENCE TO RELATED APPLICATION

This application claims the priority benefit of Taiwan application serial no. 112135432, filed on Sep. 18, 2023. The entirety of the above-mentioned patent application is hereby incorporated by reference herein and made a part of this specification.

BACKGROUND

Technical Field

The disclosure relates to a manufacturing method of a semiconductor structure, and in particular, to a manufacturing method of a semiconductor structure including an edge trimming process.

Description of Related Art

In the semiconductor manufacturing process, after two wafers are bonded, an edge trimming process is performed on the wafer to prevent breakage from occurring to the wafer. However, after the edge trimming process is performed on the, a damaged region will be formed on the wafer. Since there will be residual stress in the damaged region, the wafer is prone to breakage during subsequent transportation and subsequent processes. Therefore, it is a continuous goal on how to prevent wafer breakage.

SUMMARY

The disclosure provides a manufacturing method of a semiconductor structure, which can effectively prevent breakage from occurring to a wafer during subsequent transportation and subsequent processes.

The disclosure provides a manufacturing method of a semiconductor structure including the following steps. A first wafer is provided. The first wafer includes a first substrate and a first device layer. The first device layer is located on the first substrate. A second wafer is provided. The second wafer includes a second substrate and a second device layer. The second device layer is located on the second substrate. The second device layer is bonded to the first device layer. An edge trimming process is performed on the first wafer and the second wafer to expose a first upper surface of the first substrate and a second upper surface of the first substrate and to form a damaged region in the first substrate below the first upper surface and the second upper surface. The second upper surface is higher than the first upper surface. A first photoresist layer is formed. The first photoresist layer is located on the second wafer and the second upper surface and exposes the first upper surface and the damaged region. The damaged region is removed by using the first photoresist layer as a mask. The first photoresist layer is removed.

According to an embodiment of the disclosure, in the manufacturing method of the semiconductor structure, after the edge trimming process is performed, the first substrate may include a two-step structure.

According to an embodiment of the disclosure, in the manufacturing method of the semiconductor structure, the edge trimming process may include the following steps. A grinder is used to grind the second wafer and the first wafer to expose the first upper surface. The grinder is moved and the grinder is used to grind the second wafer to expose the second upper surface.

According to an embodiment of the disclosure, in the manufacturing method of the semiconductor structure, the method of removing the damaged region may include performing an etching process on the damaged region.

According to an embodiment of the disclosure, in the manufacturing method of the semiconductor structure, during the etching process, a removal rate of the damaged region of the first substrate may be greater than a removal rate of the remaining portion of the first substrate.

According to an embodiment of the disclosure, in the manufacturing method of the semiconductor structure, the etching process is, for example, a wet etching process, a dry etching process, or a combination thereof.

According to an embodiment of the disclosure, in the manufacturing method of the semiconductor structure, the method of forming the first photoresist layer may include the following steps. A photoresist material layer is formed on the first wafer and the second wafer. An edge bead removal (EBR) process is performed on the photoresist material layer.

According to an embodiment of the disclosure, in the manufacturing method of the semiconductor structure, the method of bonding the second device layer to the first device layer is, for example, a hybrid bonding method.

According to an embodiment of the disclosure, in the manufacturing method of the semiconductor structure, the method of bonding the second device layer to the first device layer is, for example, a fusion bonding method.

According to an embodiment of the disclosure, the manufacturing method of the semiconductor structure may further include the following steps. A thinning process is performed on the second substrate.

According to an embodiment of the disclosure, the manufacturing method of the semiconductor structure may further include the following steps. After the first photoresist layer is removed, a second photoresist layer is formed on a portion of a sidewall of the first wafer and a sidewall of the second wafer. The second photoresist layer may expose a top surface of the second substrate. The second substrate is removed by using the second photoresist layer as a mask. The second photoresist layer is removed. A dielectric layer is formed on a sidewall of the first device layer and a sidewall of the second device layer.

According to an embodiment of the disclosure, in the manufacturing method of the semiconductor structure, after the damaged region is removed, a third upper surface of the first substrate may be exposed. The dielectric layer may further be formed on the third upper surface and a top surface of the second device layer.

According to an embodiment of the disclosure, in the manufacturing method of the semiconductor structure, the dielectric layer may be a single-layer structure.

According to an embodiment of the disclosure, in the manufacturing method of the semiconductor structure, the dielectric layer may be a multi-layer structure.

According to an embodiment of the disclosure, in the manufacturing method of the semiconductor structure, the method of removing the second substrate is, for example, performing a wet etching process on the second substrate.

According to an embodiment of the disclosure, in the manufacturing method of the semiconductor structure, an etchant used in the wet etching process is, for example, tetramethylammonium hydroxide (TMAH).

According to an embodiment of the disclosure, in the manufacturing method of the semiconductor structure, the second wafer may further include a stop layer. The stop layer is located between the second substrate and the second device layer.

According to an embodiment of the disclosure, in the manufacturing method of the semiconductor structure, the stop layer may be used as an etch stop layer to remove the second substrate.

According to an embodiment of the disclosure, in the manufacturing method of the semiconductor structure, during the wet etching process, a removal rate of the second substrate may be greater than a removal rate of the stop layer.

According to an embodiment of the disclosure, in the manufacturing method of a semiconductor structure, the stop layer may be located between the dielectric layer and the second device layer.

Based on the above, in the manufacturing method of the semiconductor structure provided by the disclosure, the edge trimming process is performed on the first wafer and the second wafer to expose the first upper surface of the first substrate and the second upper surface of the first substrate and to form the damaged region in the first substrate below the first upper surface and the second upper surface. The second upper surface is higher than the first upper surface. The first photoresist layer is formed. The first photoresist layer is located on the second wafer and the second upper surface and exposes the first upper surface and the damaged region. The damaged region is removed by using the first photoresist layer as the mask. In this way, since the damaged region of the first substrate has been removed, it can effectively prevent breakage from occurring to the first wafer during subsequent transportation and subsequent processes.

In order to make the above-mentioned features and advantages of the disclosure clearer and easier to understand, the following embodiments are given and described in details with accompanying drawings as follows.

DESCRIPTION OF THE EMBODIMENTS

Figure 1A:
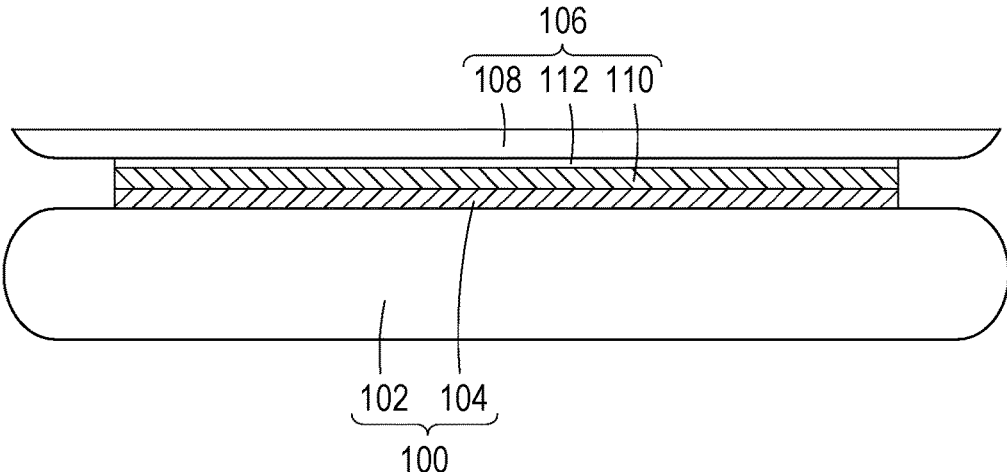
FIG. 1A to FIG. 1J are cross-sectional views of a manufacturing process of a semiconductor structure according to some embodiments of the disclosure.

The following embodiments will be described in details with reference to the accompanying drawings, but the embodiments provided are not intended to limit the scope of the disclosure. In order to facilitate understanding, the same elements will be described with reference to the same reference numerals in the following embodiments. In addition, the drawings are for description purposes only and may not be shown to scale. In fact, for clarity of discussion, sizes of the various features may be arbitrarily enlarged or reduced.

FIG. 1A to FIG. 1J are cross-sectional views of a manufacturing process of a semiconductor structure according to some embodiments of the disclosure.

Referring to FIG. 1A, a wafer 100 is provided. The wafer 100 includes a substrate 102 and a device layer 104. In some embodiments, the substrate 102 may be a semiconductor substrate, such as a silicon substrate. The device layer 104 is located on the substrate 102. Although not shown in the FIGURE, the device layer 104 may include a semiconductor component (e.g., an active component and/or a passive component), an interconnect structure, a dielectric layer, a bonding pad, or a combination thereof.

Additionally, a wafer 106 is provided. The wafer 106 includes a substrate 108 and a device layer 110. In some embodiments, the substrate 108 may be a semiconductor substrate, such as a silicon substrate. The device layer 110 is located on substrate 108. Although not shown in the FIGURE, the device layer 110 may include a semiconductor component (e.g., an active component and/or a passive component), an interconnect structure, a dielectric layer, a bonding pad, or a combination thereof. In some embodiments, the wafer 106 may further include a stop layer 112. The stop layer 112 is located between the substrate 108 and the device layer 110. In some embodiments, the material of the stop layer 112 is, for example, silicon oxide or silicon nitride.

Next, the device layer 110 is bonded to the device layer 104. In some embodiments, the method of bonding the device layer 110 to the device layer 104 is, for example, a hybrid bonding method or a fusion bonding method. In some embodiments, the dielectric layer and the bonding pad in the device layer 110 can be bonded to the dielectric layer and the bonding pad in the device layer 104, respectively, by the hybrid bonding method. In other embodiments, the dielectric layer in the device layer 110 can be bonded to the dielectric layer in the device layer 104 by the fusion bonding method. In some embodiments, a thinning process is performed on the substrate 108. In some embodiments, after the device layer 110 is bonded to the device layer 104, the thinning process is performed on the substrate 108.

Figure 1B:
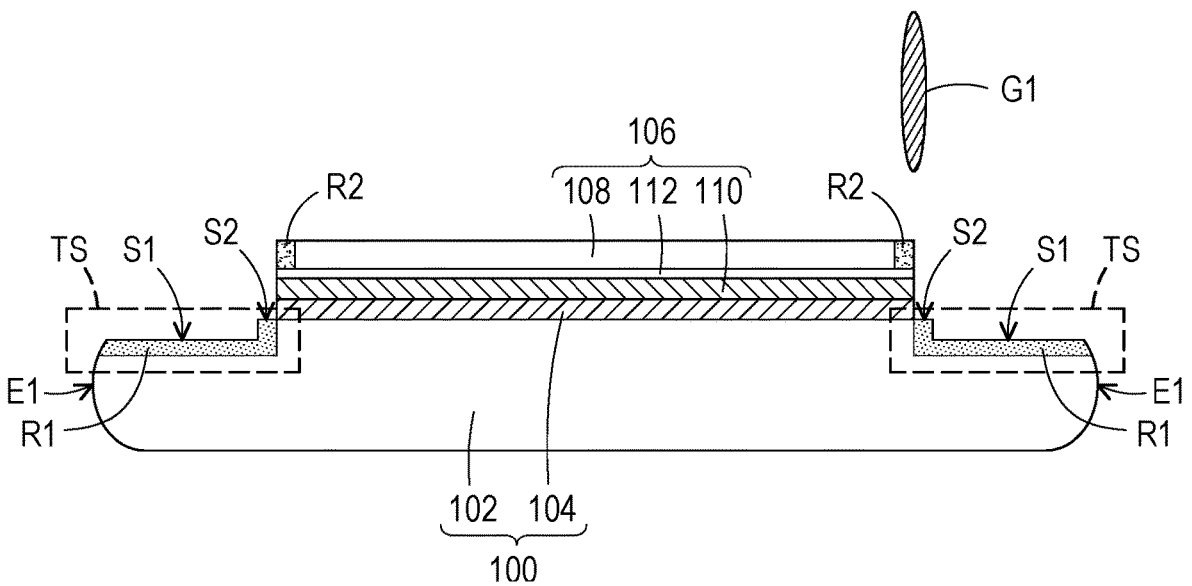

Referring to FIG. 1B, an edge trimming process is performed on the wafer 100 and the wafer 106 to expose an upper surface S1 of the substrate 102 and an upper surface S2 of the substrate 102 and to form a damaged region R1 in the substrate 102 below the upper surface S1 and the upper surface S2. The upper surface S2 is higher than the upper surface S1. In some embodiments, the upper surface S1 may be closer to an end E1 of the substrate 102 than the upper surface S2. In some embodiments, the upper surface S2 may be closer to the wafer 106 than the upper surface S1. In some embodiments, during the edge trimming process, a damaged region R2 is formed at an edge of the substrate 108. In some embodiments, after the edge trimming process is performed, the substrate 102 may include a two-step structure TS. In some embodiments, the edge trimming process may include the following steps. First, a grinder G1 is used to grind the wafer 106 and the wafer 100 to expose the upper surface S1. Next, the grinder G1 is moved and the grinder G1 is used to grind the wafer 106 to expose the upper surface S2.

Figure 1C:
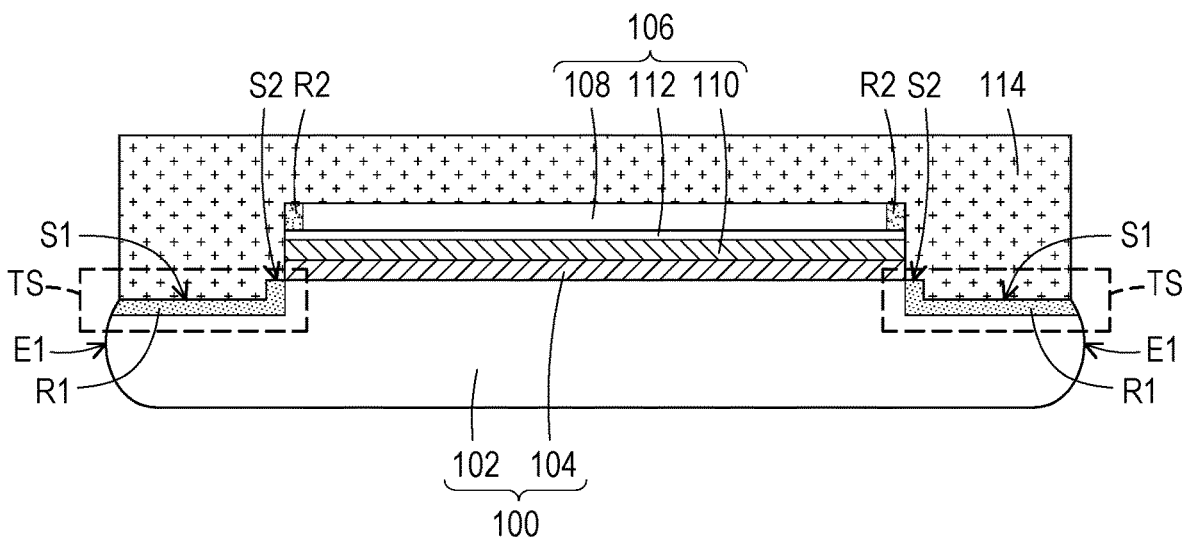

Referring to FIG. 1C, a photoresist material layer 114 may be formed on the wafer 100 and the wafer 106. In some embodiments, the method of forming the photoresist material layer 114 is, for example, a coating method.

Figure 1D:
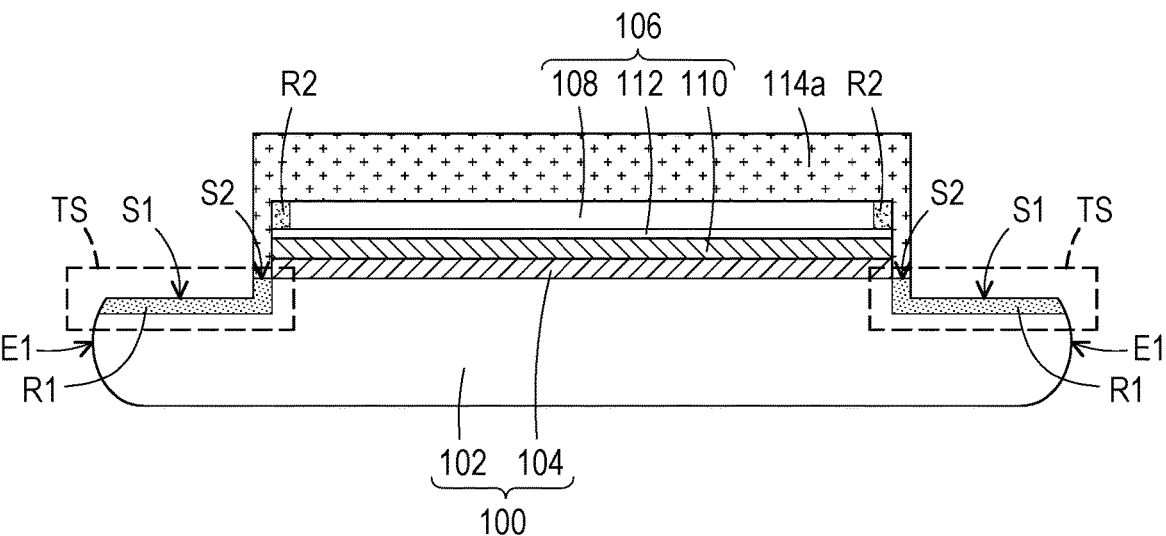

Referring to FIG. 1D, an edge bead removal (EBR) process may be performed on the photoresist material layer, so that a photoresist layer 114a may be formed. The photoresist layer 114a is located on the wafer 106 and the upper surface S2 and exposes the upper surface S1 and the damaged region R1.

Figure 1E:
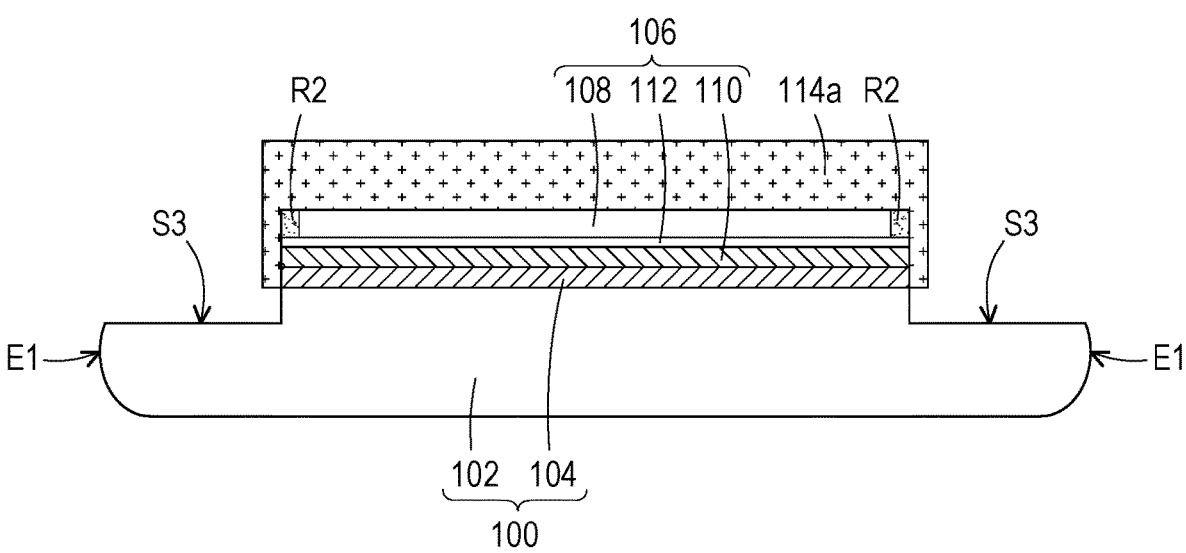

Referring to FIG. 1E, the photoresist layer 114a is used as a mask to remove the damaged region R1. In this way, since the damaged region R1 of the substrate 102 has been removed, it can effectively prevent breakage from occurring to the wafer 100 during subsequent transportation and subsequent processes. After the damaged region R1 is removed, an upper surface S3 of the substrate 102 may be exposed. In some embodiments, the method of removing the damaged region R1 may include performing an etching process on the damaged region R1. In some embodiments, during the etching process, a removal rate of the damaged region R1 of the substrate 102 may be greater than a removal rate of the remaining portion of the substrate 102. In some embodiments, the material of the damaged region R1 may be amorphous silicon, and the material of the remaining portion of the substrate 102 may be crystalline silicon. During the etching process, since an etching rate of amorphous silicon may be greater than an etching rate of crystalline silicon, the removal rate of the damaged region R1 of the substrate 102 may be greater than the removal rate of the remaining portion of the substrate 102. In some embodiments, the etching process is, for example, a wet etching process, a dry etching process, or a combination thereof.

Figure 1F:
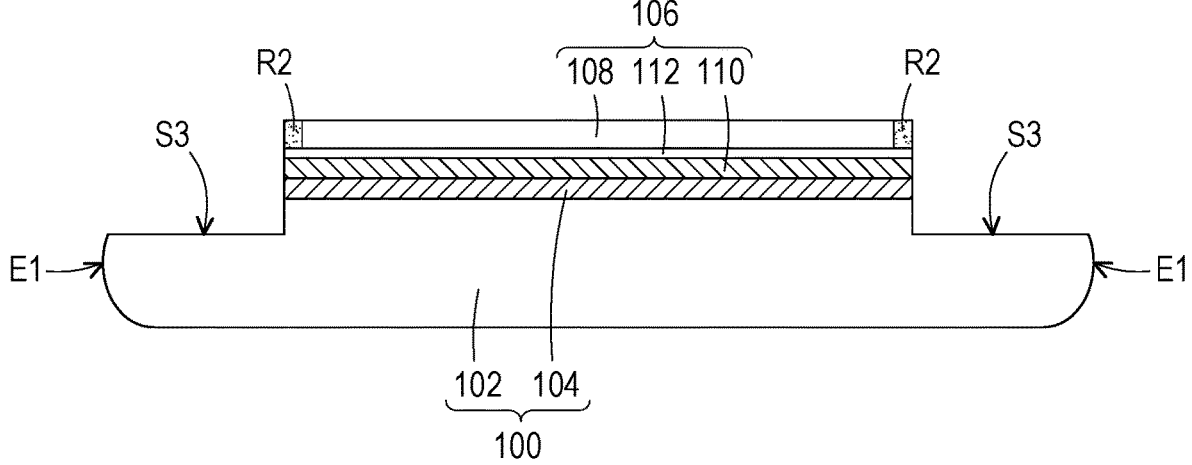

Referring to FIG. 1F, the photoresist layer 114a is removed. In some embodiments, the method of removing the photoresist layer 114a is, for example, a dry stripping method or a wet stripping method.

Figure 1G:
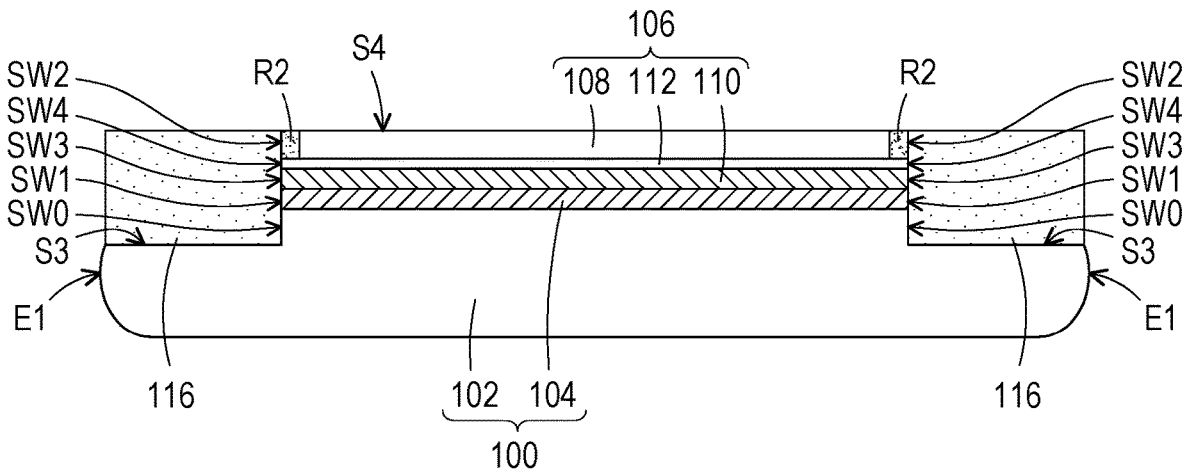

Please refer to FIG. 1G, after the photoresist layer 114a is removed, a photoresist layer 116 is formed on a portion of a sidewall of the wafer 100 (e.g., a sidewall SW0 of the substrate 102 and a sidewall SW1 of the device layer 104) and a sidewall of the wafer 106 (e.g., a sidewall SW2 of the substrate 108, a sidewall SW3 of the device layer 110, and a sidewall SW4 of the stop layer 112. The photoresist layer 116 may further be formed on the upper surface S3. The photoresist layer 116 may expose a top surface S4 of the substrate 108. In some embodiments, the method of forming the photoresist layer 116 is, for example, a coating method.

Figure 1H:
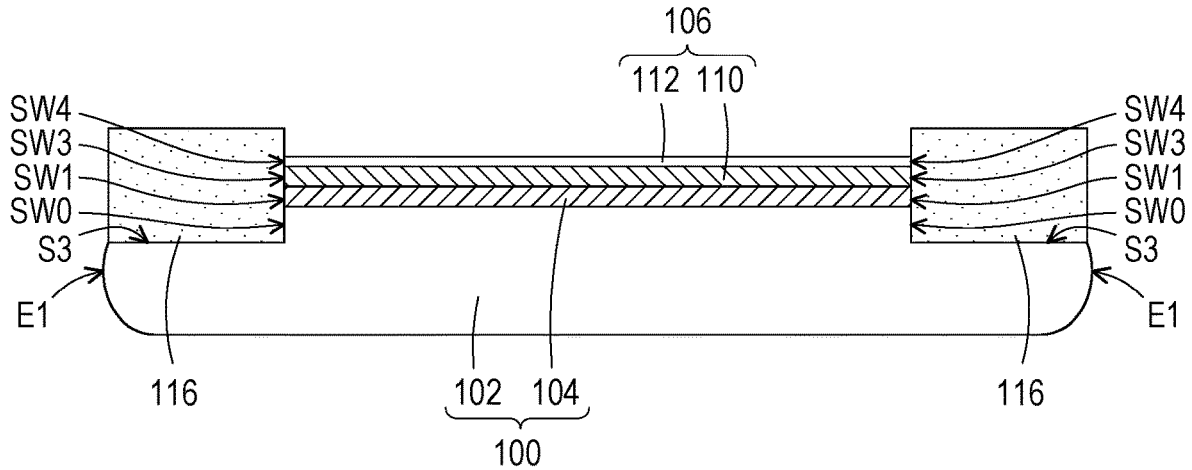

Referring to FIG. 1H, the photoresist layer 116 may be used as a mask to remove the substrate 108. In some embodiments, the stop layer 112 may be used as an etch stop layer to remove the substrate 108. In some embodiments, the method of removing the substrate 108 is, for example, performing a wet etching process on the substrate 108. In some embodiments, during the wet etching process, a removal rate of the substrate 108 may be greater than a removal rate of the stop layer 112. In some embodiments, an etchant used in the wet etching process is, for example, tetramethylammonium hydroxide (TMAH).

Figure 1I:
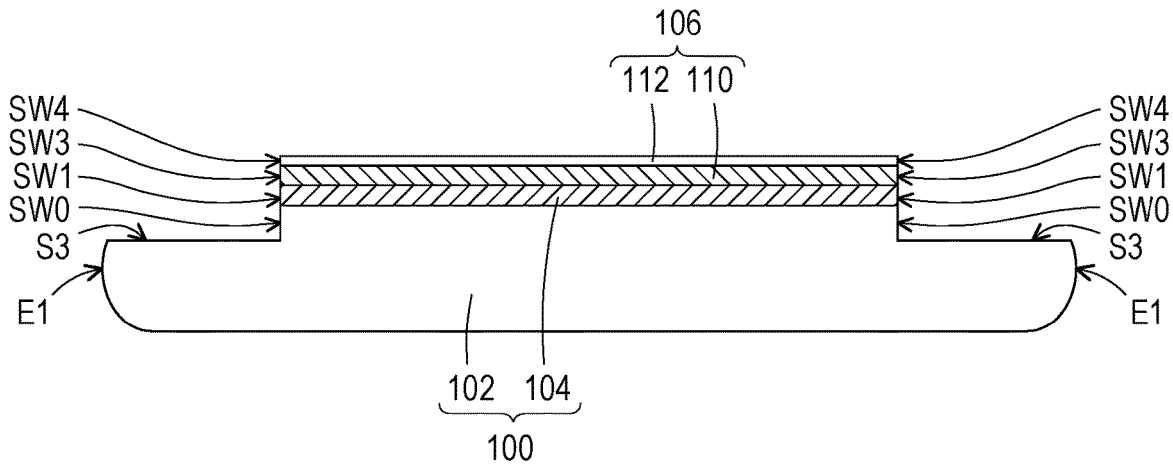

Referring to FIG. 1I, the photoresist layer 116 can be removed. In some embodiments, the method of removing the photoresist layer 116 is, for example, a dry stripping method or a wet stripping method.

Figure 1J:
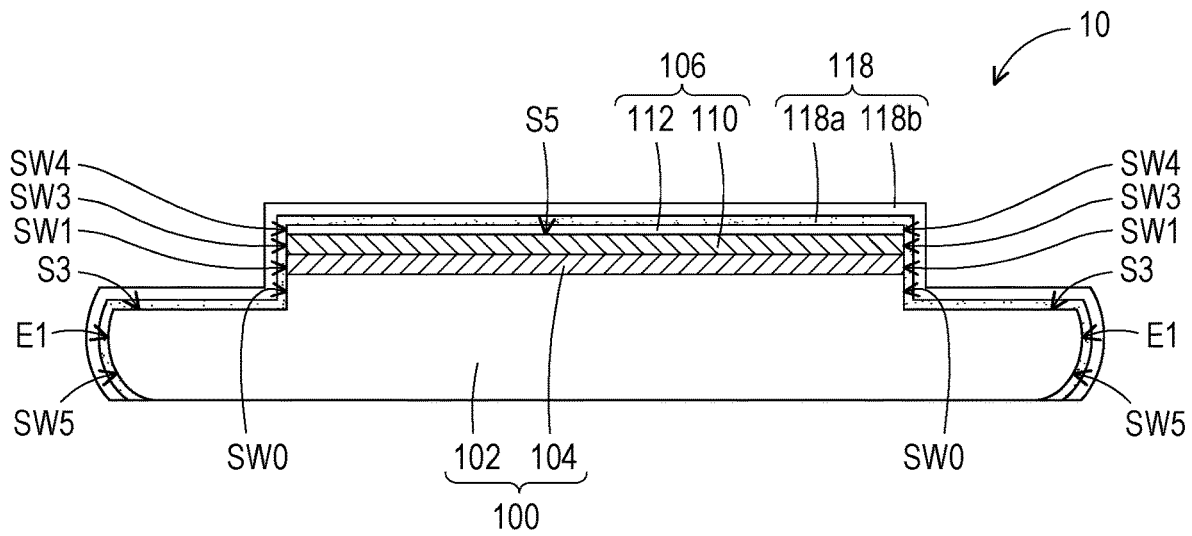

Referring to FIG. 1J, a dielectric layer 118 may be formed on the sidewall SW1 of the device layer 104 and the sidewall SW3 of the device layer 110. The dielectric layer 118 may protect the sidewall SW1 of the device layer 104 and the sidewall SW3 of the device layer 110 and may be used to adjust stress. In some embodiments, the dielectric layer 118 may be further formed on the upper surface S3 and a top surface S5 of the device layer 110. In some embodiments, the dielectric layer 118 may be formed on the stop layer 112. In some embodiments, the stop layer 112 may be located between the dielectric layer 118 and the device layer 110. In some embodiments, the dielectric layer 118 may be further formed on the sidewall SW4 of the stop layer 112, the sidewall SW0 of the substrate 102, and a sidewall SW5 of the substrate 102. In some embodiments, the dielectric layer 118 may be a single-layer structure or a multi-layer structure. In some embodiments, the material of the dielectric layer 118 is, for example, silicon oxide, silicon nitride, silicon oxynitride (SiON), silicon nitride carbide (SiCN), or a combination thereof. In some embodiments, the method of forming the dielectric layer 118 is, for example, a chemical vapor deposition method.

In some embodiments, the dielectric layer 118 may include a dielectric layer 118a and a dielectric layer 118b. The dielectric layer 118b is located on the dielectric layer 118a. In some embodiments, the material of the dielectric layer 118a may be different from the material of the dielectric layer 118b. In some embodiments, the dielectric layer 118a and the dielectric layer 118b may have different n values (i.e., refractive indices). In some embodiments, the material of the dielectric layer 118a and the material of the dielectric layer 118b may have different k values (i.e., dielectric constants). In some embodiments, as shown in FIG. 1J, the dielectric layer 118a and the dielectric layer 118b may have different thicknesses. In other embodiments, the dielectric layer 118a and the dielectric layer 118b may have the same thickness.

Based on the above embodiments, it can be seen that in the manufacturing method of a semiconductor structure 10, the edge trimming process is performed on the wafer 100 and the wafer 106 to expose the upper surface S1 of the substrate 102 and the upper surface S2 of the substrate 102 and to form the damaged region R1 in the substrate 102 below the upper surface S1 and the upper surface S2. The upper surface S2 is higher than the upper surface S1. The photoresist layer 114a is formed. The photoresist layer 114a is located on the wafer 106 and the upper surface S2 and exposes the upper surface S1 and the damaged region R1. The damaged region R1 is removed by using the photoresist layer 114a as the mask. In this way, since the damaged region R1 of the substrate 102 has been removed, it can effectively prevent breakage from occurring to the wafer 100 during subsequent transportation and subsequent processes.

In summary, since the manufacturing method of the semiconductor structure of the above embodiments can remove the damaged region formed during the edge trimming process, it can effectively prevent breakage from occurring to the wafer during subsequent transportation and subsequent processes.

Although the disclosure has been described with reference to the embodiments above, the embodiments are not intended to limit the disclosure. Any person skilled in the art can make some changes and modifications without departing from the spirit and scope of the disclosure. Therefore, the scope of the disclosure shall be defined in the appended claims.

What is claimed is:

1. A manufacturing method of a semiconductor structure, comprising:

providing a first wafer, wherein the first wafer comprises a first substrate and a first device layer, and the first device layer is located on the first substrate;

providing a second wafer, wherein the second wafer comprises a second substrate and a second device layer, and the second device layer is located on the second substrate;

bonding the second device layer to the first device layer;

performing an edge trimming process on the first wafer and the second wafer to expose a first upper surface of the first substrate and a second upper surface of the first substrate and to form a damaged region in the first substrate below the first upper surface and the second upper surface, wherein the second upper surface is higher than the first upper surface;

forming a first photoresist layer, wherein the first photoresist layer is located on the second wafer and the second upper surface and exposes the first upper surface and the damaged region;

removing the damaged region by using the first photoresist layer as a mask; and removing the first photoresist layer.

2. The manufacturing method of the semiconductor structure according to claim 1, wherein the first substrate comprises a two-step structure after the edge trimming process is performed.

3. The manufacturing method of the semiconductor structure according to claim 1, wherein the edge trimming process comprises:

using a grinder to grind the second wafer and the first wafer to expose the first upper surface; and moving the grinder and using the grinder to grind the second wafer to expose the second upper surface.

4. The manufacturing method of the semiconductor structure according to claim 1, wherein the method of removing the damaged region comprises performing an etching process on the damaged region.

5. The manufacturing method of the semiconductor structure according to claim 4, wherein during the etching process, a removal rate of the damaged region of the first substrate is greater than a removal rate of a remaining portion of the first substrate.

6. The manufacturing method of the semiconductor structure according to claim 4, wherein the etching process comprises a wet etching process, a dry etching process, or a combination thereof.

7. The manufacturing method of the semiconductor structure according to claim 1, wherein the method of forming the first photoresist layer comprises:

forming a photoresist material layer on the first wafer and the second wafer; and performing an edge bead removal process on the photoresist material layer.

8. The manufacturing method of the semiconductor structure according to claim 1, wherein the method of bonding the second device layer to the first device layer comprises a hybrid bonding method.

9. The manufacturing method of the semiconductor structure according to claim 1, wherein the method of bonding the second device layer to the first device layer comprises a fusion bonding method.

10. The manufacturing method of the semiconductor structure according to claim 1, further comprising:

performing a thinning process on the second substrate.

11. The manufacturing method of the semiconductor structure according to claim 1, further comprising:

forming a second photoresist layer on a portion of a sidewall of the first wafer and a sidewall of the second wafer after the first photoresist layer is removed, wherein the second photoresist layer exposes a top surface of the second substrate;

removing the second substrate by using the second photoresist layer as a mask; and removing the second photoresist layer; and forming a dielectric layer on a sidewall of the first device layer and a sidewall of the second device layer.

12. The manufacturing method of the semiconductor structure according to claim 11, further comprising exposing a third upper surface of the first substrate after the damaged region is removed, and further forming the dielectric layer on the third upper surface and a top surface of the second device layer.

13. The manufacturing method of the semiconductor structure according to claim 11, wherein the dielectric layer comprises a single-layer structure.

14. The manufacturing method of the semiconductor structure according to claim 11, wherein the dielectric layer comprises a multi-layer structure.

15. The manufacturing method of the semiconductor structure according to claim 11, wherein the method of removing the second substrate comprises performing a wet etching process on the second substrate.

16. The manufacturing method of the semiconductor structure according to claim 15, wherein an etchant used in the wet etching process comprises tetramethylammonium hydroxide.

17. The manufacturing method of the semiconductor structure according to claim 15, wherein the second wafer further comprises:

a stop layer, located between the second substrate and the second device layer.

18. The manufacturing method of the semiconductor structure according to claim 17, wherein the second substrate is removed by using the stop layer as an etch stop layer.

19. The manufacturing method of the semiconductor structure according to claim 17, wherein during the wet etching process, a removal rate of the second substrate is greater than a removal rate of the stop layer.

20. The manufacturing method of the semiconductor structure according to claim 17, wherein the stop layer is located between the dielectric layer and the second device layer.

* * * * *